United States Patent [19]

Suthers et al.

[11] Patent Number: 4,642,507
[45] Date of Patent: Feb. 10, 1987

[54] SAW DEVICES WITH REFLECTION-SUPPRESSING FINGERS

[75] Inventors: Mark S. Suthers, Lanark; Grantley O. Este, Stittsville; Richard W. Streater; Blair K. MacLaurin, both of Nepean, all of Canada

[73] Assignee: Northern Telecom Limited, Montreal, Canada

[21] Appl. No.: 718,589

[22] Filed: Apr. 1, 1985

[51] Int. Cl.$^4$ ............................................. H01L 41/08
[52] U.S. Cl. .............................. 310/313 B; 310/313 C; 333/151; 333/195
[58] Field of Search .................... 367/164; 310/313 C, 310/313 B, 313 R, 313 D; 29/25.35; 333/151, 195

[56] References Cited

U.S. PATENT DOCUMENTS

| | | | |
|---|---|---|---|
| 4,030,050 | 6/1977 | Deacon et al. | 333/72 |
| 4,139,791 | 2/1979 | Yamada et al. | 310/313 C |
| 4,201,964 | 5/1980 | Noro et al. | 333/151 |
| 4,206,380 | 6/1980 | Hazama et al. | 310/313 B |
| 4,223,286 | 4/1980 | Ono et al. | 333/195 |
| 4,350,963 | 9/1982 | Iwamoto et al. | 310/313 D |
| 4,420,728 | 12/1983 | Bower | 333/151 |

FOREIGN PATENT DOCUMENTS 54-12661 1/1979 Japan .

Primary Examiner—Charles T. Jordan
Assistant Examiner—John W. Eldred
Attorney, Agent, or Firm—R. John Haley

[57] ABSTRACT

Each IDT (inter-digital transducer) of a SAW (surface acoustic wave) device has a linearly tapered back edge formed by reflection-suppressing fingers of successively decreasing length spaced apart with a pitch of lambda/4 behind the active region of the IDT, where lambda is the wavelength of a SAW to be propagated, whereby SAW reflections at the back edge of the IDT are substantially eliminated. A thin resistive doped silicon film between the back edge of each IDT and the adjacent edge of the substrate absorbs waves propagated via this back edge. The film underlies the IDTs to provide improved adhesion to the substrate.

25 Claims, 3 Drawing Figures

SAW DEVICES WITH REFLECTION-SUPPRESSING FINGERS

This invention relates to SAW (surface acoustic wave) devices, and is particularly concerned with a SAW device which includes at least one IDT (inter-digital transducer) including reflection-suppressing fingers.

Reference is directed to a copending patent application assigned to Northern Telecom Limited, filed on the same date as this application and entitled "SAW devices including resistive films", the entire disclosure of which is hereby incorporated herein by reference.

It is well known to provide a SAW device for use as a bandpass filter. Generally, such a SAW device comprises two IDTs which are spaced from and aligned with one another on the surface of a substrate of a suitable material, such as lithium niobate ($LiNbO_3$), for the propagation of surface acoustic waves therebetween. One of the IDTs is driven with a signal to be filtered and constitutes an input transducer, and the filtered signal is derived from the other IDT which constitutes an output transducer.

For convenience and clarity in this specification, the edge of each IDT which is nearest to the other IDT is referred to as the front edge of the IDT, and the edge of each IDT which is furthest from the other IDT, and hence is generally closest to an edge of the substrate, is referred to as the back edge of the IDT. Thus the surface acoustic waves are propagated between the front edges of the two IDTs.

A problem arises in that each IDT transduces undesired surface acoustic waves which propagate in the direction of its back edge as well as the desired waves in the direction of its front edge. In order to prevent such undesired waves from being reflected at the edges of the substrate and interfering with the desired waves, thereby degrading the performance of the SAW device, it is known to apply an acoustic absorber to the surface of the substrate between the back edge of each IDT and the edge of the substrate. The acoustic absorber, which may for example be an epoxy material, is generally inconvenient to apply during manufacture of the SAW device, and may itself produce an undesired surface acoustic wave reflection. It is also known to cut the substrate edges at angles so that reflected waves are not directed back into the region of the IDTs, but again this is an inconvenience during manufacture of the SAW device.

It has been discovered that surface acoustic wave reflections also occur directly at the back edges of the IDTs. The surface acoustic waves produced by these reflections are not suppressed by the measures described above, and produce an undesired ripple in the pass band of a bandpass filter incorporating the SAW device.

An object of this invention, therefore, is to provide an improved SAW device in which undesired reflected surface acoustic waves are reduced.

According to this invention there is provided a SAW (surface acoustic wave) device comprising: a substrate having an IDT (inter-digital transducer) on a surface thereof, the IDT comprising: an active region of inter-digital fingers, for transducing a surface acoustic wave with a predetermined wavelength lambda for propagation on said surface via a front edge of the IDT with a predetermined aperture; and a reflection-suppressing region having an aperture which is at least substantially as large as said predetermined aperture adjacent to the active region and comprising a plurality of electrically interconnected fingers spaced apart with a pitch of lambda/4 and defining a tapered back edge of the IDT across at least part of said aperture.

The wavelength lambda will generally be the wavelength of the center frequency of the surface acoustic wave to be propagated, but this need not necessarily be the case.

The tapered back edge of the IDT provides for only a small surface acoustic wave reflection from the end of each finger in the reflection-suppressing region. The lambda/4 spacing of the fingers in this region results in reflections from adjacent fingers having a Phase difference of lambda/2, or a half wavelength, whereby they substantially completely cancel one another to substantially eliminate reflections from the back edge of the IDT.

In one embodiment of the invention the IDT comprises a conductive rail to which a back one of the fingers in the active region is electrically connected, and the fingers in the reflection-suppressing region are electrically connected to said conductive rail and have lengths which successively decrease from the length of said back one of the fingers in the active region to define said back edge of the IDT with a substantially linear taper across at least part of said aperture. Preferably said back one of the fingers in the active region extends across substantially all of said aperture and said fingers in the reflection-suppressing region define said back edge of the IDT with said substantially linear taper across substantially all of said aperture. This arrangement is particularly convenient for a non-apodized IDT.

In another embodiment of the invention the IDT comprises two conductive rails to which the inter-digital fingers in the active region are alternately connected, the active region includes main and dummy fingers aligned with and opposite one another, each connected to a respective one of said rails and having a gap therebetween, and the fingers in the reflection-suppressing region extend on at least one side of the last gap between main and dummy fingers in the active region and are electrically connected to the conductive rail on that side, the lengths of the fingers in the reflection-suppressing region decreasing successively to define said back edge of the IDT with a substantially linear taper from said last gap.

For an apodized IDT, in which this last gap is not normally at one side of the aperture, preferably the fingers in the reflection-suppressing region extend on both sides of said last gap, the fingers on each side being electrically connected to the conductive rail on that side, to define said back edge of the IDT with two substantially linear tapers each from said last gap towards a respective one of said two conductive rails.

The SAW device preferably includes a surface acoustic wave absorber on said surface between the back edge of the IDT and an edge of the substrate, the absorber having a tapered front edge substantially complementary to the tapered back edge of the IDT. This absorber serves to absorb surface acoustic waves propagated via the back edge of the IDT which might otherwise be reflected back into the IDT from the edge of the substrate. The provision of an effective surface acoustic wave absorber avoids any need to cut the edge of the substrate at an angle, as has been done in known SAW devices.

Preferably the surface acoustic wave absorber comprises a thin resistive film, advantageously a silicon film having a sheet resistivity of at least about 0.5 Mohm/sq, on the substrate surface. Conveniently this film extends beneath the fingers and conductive rails of the IDT, thereby providing improved adhesion of these conductive parts of the IDT to the substrate.

The main and dummy fingers in the active region of the IDT advantageously each comprise a pair of equal-length fingers spaced apart with a pitch of lambda/4. This reduces reflections at the fingers in the active region of the IDT, and provides the convenience that all of the fingers throughout the IDT have the same spacing.

The invention also extends to a SAW device comprising a substrate having two IDTs on a surface thereof for propagating a surface acoustic wave therebetween, each IDT comprising an active region and a reflection-suppressing region as recited above.

According to another aspect of this invention there is provided a SAW (surface acoustic wave) device comprising a substrate having an IDT (inter-digital transducer) on a surface thereof, the IDT comprising: an active region of inter-digital fingers, for transducing a surface acoustic wave for propagation on said surface via a front edge of the IDT with a predetermined aperture; and a reflection-suppressing region having an aperture which is at least substantially as large as said predetermined aperture, adjacent to the active region and comprising a plurality of electrically interconnected fingers defining a tapered back edge of the IDT across at least part of said aperture, the fingers in the reflection-suppressing region being spaced apart with a pitch other than n.lambda/2 where n is an integer and lambda is a wavelength of the propagated surface acoustic wave.

The invention will be further understood from the following description with reference to the accompanying drawings, in which.

Figure 1:
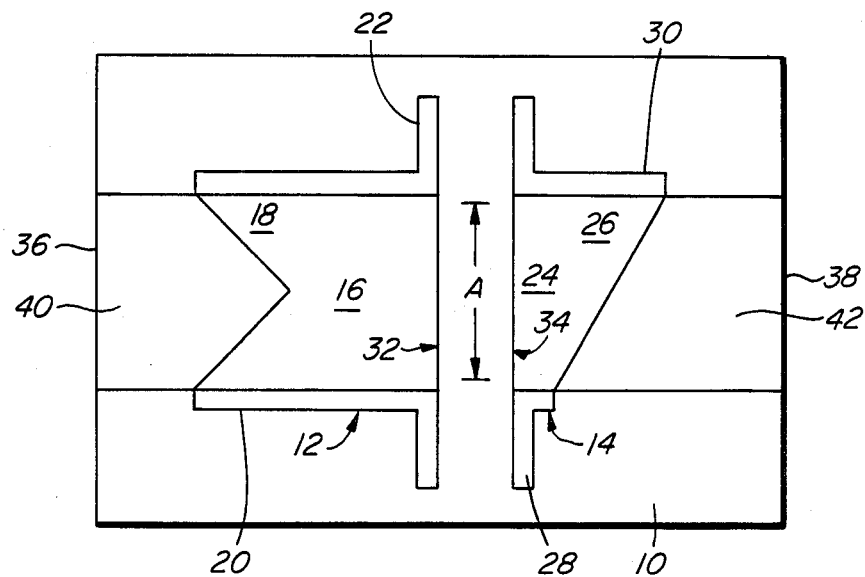
FIG. 1 is a schematic illustration of a SAW device in accordance with the invention.
Figure 2:
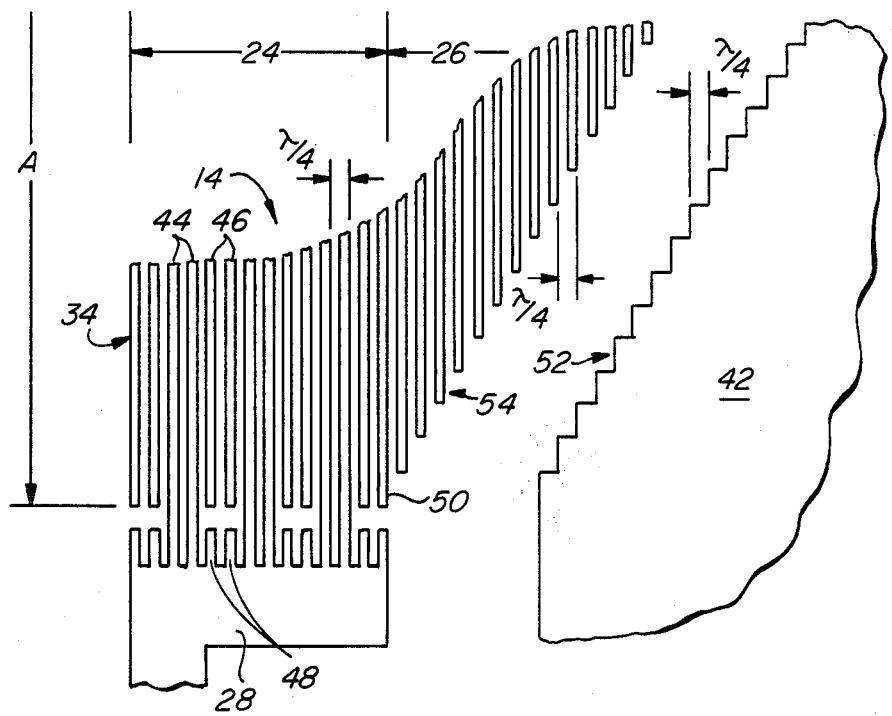
FIG. 2 is a greatly enlarged schematic illustration of part of a SAW device in accordance with the invention.
Figure 3:
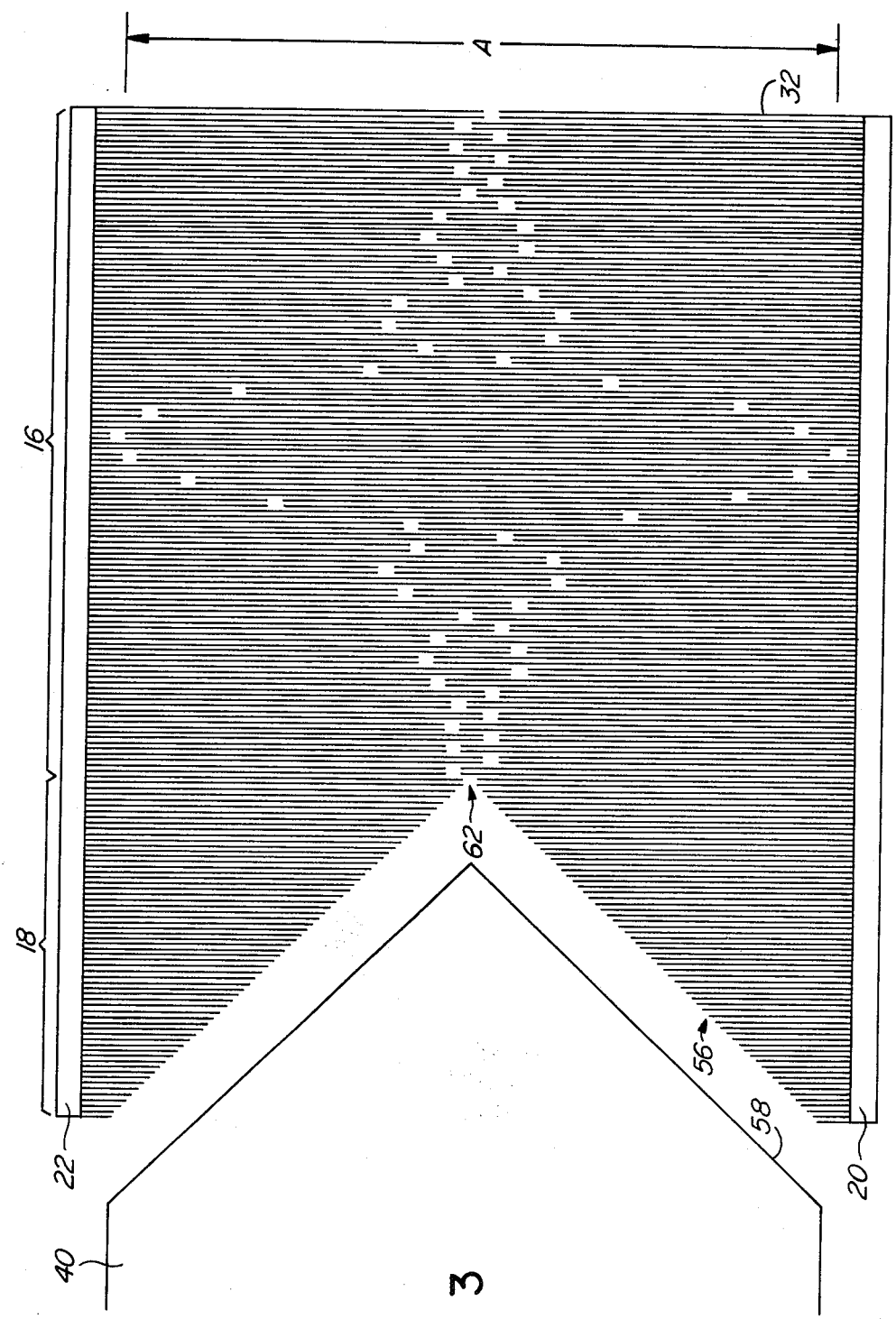
FIG. 3 is a schematic illustration of an apodized IDT and adjacent electro-acoustic absorber of a SAW device in accordance with the invention.

Referring to FIG. 1, a general form of a SAW device in accordance with the invention is illustrated. As shown, the SAW device comprises a lithium niobate substrate 10 on which are formed two IDTs 12 and 14 for propagation of surface acoustic waves therebetween. For the sake of clarity in FIG. 1, the individual interdigital fingers of the IDTs are not shown, these being described in detail below. By way of example, it is observed that the IDT 12 may be an apodized IDT as illustrated in FIG. 3 and the IDT 14 may be a non-apodized IDT having a form as partly illustrated in FIG. 2, serving respectively as the input and output transducers of a bandpass filter.

Each of the IDTs 12 and 14 comprises interdigital fingers forming two distinct parts of the IDT, together with conductive rails for interconnecting the fingers of the IDT and making electrical connections thereto. More particularly, the IDT 12 comprises a part 16, which is referred to herein as an active region of the IDT and which has the generally convention form of an IDT as is known in the prior art, and a part 18, which is referred to herein as a reflection-suppression region of the IDT, in which the fingers are substantially linearly tapered as described in detail below. In addition, the IDT 12 comprises conductive rails 20 and 22 which interconnect the fingers and serve for making connections thereto.

Similarly, the IDT 14 comprises conventional interdigital fingers in a part 24 forming an active region, linearly tapered fingers in a part 26 forming a reflection-suppressing region, and conductive rails 28 and 30 which interconnect the fingers and serve for making connections thereto.

The IDTs 12 and 14 serve for transducing surface acoustic waves for propagation therebetween, and in particular between their front edges 32 and 34 respectively within an aperture A of the IDTs. In order to suppress surface acoustic wave reflections at the back edges of the IDTs, in accordance with this invention the abrupt IDT back edges of the prior art are replaced by the linearly tapering reflection-suppressing regions 18 and 26 of the IDTs 12 and 14 respectively. As shown in FIG. 1, the linearly tapering regions extend at least across the width of the transducer aperture A.

In addition, in order to suppress surface acoustic waves which would otherwise be able to propagate between the back edge of the IDT 12 or 14 and the adjacent edge 36 or 38 respectively of the substrate 10, a surface acoustic wave absorber 40 or 42 respectively is provided between the IDT 12 or 14 and the substrate edge 36 or 38 respectively. The absorbers 40 and 42 are tapered in a manner complementary to the tapers of the regions 18 and 26 of the IDTs, and each absorber extends at least across the width of the transducer aperture A. The absorbers 40 and 42 may optionally extend around to the sides of the IDTs 12 and 14, possibly joining up at the sides to form a continuous area of absorber around the ends and sides of the IDTs.

The absorbers 40 and 42 may, as is known in the prior art, be of a suitable material such as viscous epoxy which is applied to the surface of the substrate 10 after formation of the IDTs 12 and 14 and which may overlie fingers of the IDTs 12 and 14. In this embodiment of the invention, however, the absorbers 40 and 42 are electroacoustic absorbers which are constituted by a thin resistive film which is deposited onto the surface of the substrate 10 before, during, or after the formation of the IDTs 12 and 14 themselves. To this end, the electroacoustic absorbers are preferably formed by the method described and claimed in the copending patent application entitled "Saw devices including resistive films" already referred to. As described in that application, each electro-acoustic absorber is constituted by a thin film of for example amorphous doped silicon having a sheet resistivity of at least about 0.5 Mohm/sq. This film is for example about 100 Angstrom units (10 nm) thick and is sputtered onto the substrate 10 before formation of the IDTs thereon. The IDTs 12 and 14 are deposited onto the silicon film, which provides for improved adhesion of the fingers and rails of the IDTs. The silicon film is subsequently etched from those areas where it is not desired, such as between the IDT fingers and in the aperture A between the IDTs, and has no disadvantageous effect where it lies under the conductive fingers and rails of the IDTs because it is electrically shorted by these conductive members.

As is known, the fingers of the IDTs in their active regions 16 and 24 have a pitch of lambda/2, where lambda is the center frequency wavelength of the surface acoustic wave to be propagated. As is also known and is illustrated in FIGS. 2 and 3, each such finger may be split into a pair of identical fingers having a pitch of lambda/4, in order to suppress surface acoustic wave reflections from the individual transducer fingers themselves. As also illustrated in FIGS. 2 and 3, it is also known to provide split dummy fingers opposite the main fingers of the IDTs in order to maintain a constant surface acoustic wave velocity through each IDT across the entire aperture A.

The fingers in the reflection-suppressing regions 18 and 26 of the IDTs are likewise dummy fingers which have a pitch of lambda/4 in order to suppress reflections. Unlike the split dummy fingers in the active regions 16 and 24, which are in pairs of equal length fingers, the fingers in the regions 18 and 26 are of successively decreasing length as indicated by the linear tapers shown in FIG. 1. Each finger in the regions 18 and 26 produces only a small reflection of a surface acoustic wave reaching it, in the small region where it differs in length from the adajcent finger. Due to the linear taper this adjacent finger produces a similar small reflection, which due to the lambda/4 pitch of the fingers is out of phase with and therefore cancels the first reflection. This occurs at adjacent pairs of finger in the regions 18 and 26 across the entire width of the aperture A, whereby reflections at the back edges of the IDTs 12 and 14 are substantially eliminated.

In order to achieve a substantially complete elimination of the back edge reflections, it is desirable for each of the IDT regions 18 and 26 to include a large number of fingers, for example extending over a distance of at least 10 lambda (40 fingers). There are preferably at least 100 fingers (25 lambda) in each of these regions; in an embodiment of the invention there were 160 fingers in each of these regions, extending over a distance of 40 lambda.

In the region 26 of the IDT 14, the fingers are connected to the same conductive rail 30 as the last (i.e. nearest the back edge) main finger in the active region 24, whereby they all have the same polarity as this last main finger. In the region 18 of the IDT 12, the fingers are connected to both conductive rails 20 and 22 with successively decreasing lengths, and hence increasing gaps therebetween, starting with lengths determined by the position of the gap between the last finger in the active region 16 and the opposing dummy finger. This is illustrated more clearly in FIG. 3.

The connections of the fingers in the reflection-suppressing regions 18 and 26 to the respective conductive rails of the transducers ensure that these fingers are driven with the same polarity so that they do not themselves generate surface acoustic waves.

Using the above described amorphous silicon film to provide the acoustic absorbers 40 and 42 with an attenuation of about 0.5 dB/wavelength, each of these absorbers desirably extends between the back edge of the respective IDT and the respective substrate edge through a distance of at least 80 lambda, to provide a total attenuation of at least 80 dB for surface acoustic waves reflected at each of the substrate edges 36 and 38.

FIG. 2 illustrates in detail one form which part of the SAW device of FIG. 1 may take, similar references being used to denote similar elements. More particularly, FIG. 2 illustrates parts of the IDT 14, showing parts of fingers in the regions 24 and 26, the rail 28, and the front edge 34 of the IDT.

In FIG. 2, as already mentioned above, in the active region 24 each finger of the (non-apodized) IDT is split into two fingers of equal length with a pitch of lambda/4, and dummy split fingers are provided opposite the main split fingers. For example, in this region FIG. 2 shows in part a pair of split fingers 44 extending from the rail 28, and an adjacent pair of split fingers 46 extending from the rail 30 (not shown in FIG. 2) towards the rail 28 from which an opposing pair of dummy split fingers 48 extend. All of the fingers in FIG. 2 have a width of lambda/8 with gaps of width lambda/8 therebetween.

In FIG. 2 the last finger 50 in the active region 24 extends from the conductive rail 30, so that all of the fingers in the reflection-suppressing region 26 similarly extend from this rail 30 and have the same polarity as the finger 50. The electro-acoustic absorber 42 is in this case illustrated as being a silicon resistive film as already described above whose front edge 52 is stepped with a step pitch of lambda/4 to generally complement the back edge 54 of the IDT 14. The absorber 42 is in this example spaced by a constant distance of a few wavelengths from this back edge 54, but it may alternatively abut this edge 54 without any space. The stepped edge 52 of the absorber 42 ensures that surface acoustic wave reflections from adjacent steps at this edge cancel one another in the same manner as described above for the back edge 54 of the IDT.

FIG. 3 illustrates in detail one form which the IDT 12 of FIG. 1 may take, again using references the same as in FIG. 1 where applicable. Thus FIG. 3 shows the regions 16 and 18 of the IDT 12, its conductive rails 20 and 22, and part of the electro-acoustic absorber 40 which is spaced from the back edge 56 of the IDT 12 and has a complementary linear taper 58 as already described.

As illustrated in FIG. 3, the IDT 12 is an apodized IDT, the apodization pattern being visible in FIG. 3 in the active region 16 of the IDT. In this region 16, the fingers are split into pairs of equal length fingers with a pitch of lambda/4, with opposite dummy fingers spaced therefrom in each case by a small gap and also split into pairs of equal length fingers. The lengths of the last pair of split fingers and opposite dummy fingers, between which there is a gap 62, determine the lengths of the first fingers in the reflection-suppressing region 18 of the IDT. As illustrated in FIG. 3 the gap 62 is located centrally between the rails 20 and 22, so that the fingers in the region 18 are divided into two symmetrical halves with increasingly bigger central gaps therebetween. Other than this division of the fingers into the two halves, the fingers in the region 18 are arranged and operate in the same manner as described above with reference to FIG. 2.

In FIG. 3 the axis of the apodization pattern is parallel to the propagation direction of the surface acoustic waves. Alternatively, the axis of the apodization pattern may be inclined at an angle to the propagation direction in order to spread the discontinuities in the IDT more evenly across the width of the aperture A. In this case the gap between the last pair of split fingers and the opposite dummy fingers will generally be offset from the center of the IDT. In consequence, the fingers in the reflection-suppressing region of the IDT will be divided into two unequal parts, forming generally triangular shapes of dissimilar sizes rather than the symmetrical triangular shapes shown in FIGS. 1 and 3. In this case the lengths of the first fingers in these triangularly shaped areas are determined by the position of the gap as already described above, and the smaller triangular shape may have a smaller number of fingers and/or a more gradual taper in the reflection-suppressing region than the larger triangular shape, with corresponding changes in the shape of the acoustic absorber.

Although as described above the fingers in the reflection-suppressing regions of the IDTs are spaced with a pitch of lambda/4 at the center frequency of the surface acoustic wave, this need not necessarily be the case. More generally, the provision of tapered reflection-suppressing fingers spaced apart with other pitches will collectively provide for suppression of reflections at the back edge of the IDT, provided that the pitch is other than n.lambda/2, where n is an integer and lambda is a wavelength of the propagated surface acoustic wave.

Numerous other modifications, variations, and adaptations may be made to the particular embodiments described above without departing from the scope of the invention as defined by the claims.

What is claimed is:

1. A SAW (surface acoustic wave) device comprising a substrate having an IDT (inter-digital transducer) on a surface thereof, the IDT comprising:
   an active region of inter-digital fingers, for transducing a surface acoustic wave with a predetermined wavelength lambda for propagation on said surface via a front edge of the IDT with a predetermined aperture; and
   a reflection-suppressing region, having an aperture which is at least substantially as large as said predetermined aperture adjacent to the active region and comprising a plurality of of electrically interconnected fingers spaced apart with a pitch of lambda/4 and defining a tapered back edge of the IDT across at least part of said aperture.

2. A SAW device as claimed in claim 1 wherein the IDT comprises a conductive rail to which a back one of the fingers in the active region is electrically connected, and wherein the fingers in the reflection-suppressing region are electrically connected to said conductive rail and have lengths which successively decrease from the lengths of said back one of the fingers in the active region to define said back edge of the IDT with a substantially linear taper across at least part of said aperture.

3. A SAW device as claimed in claim 2 wherein said back one of the fingers in the active region extends across substantially all of said aperture and said fingers in the reflection-suppressing region define said back edge of the IDT with said substantially linear taper across substantially all of said aperture.

4. A SAW device as claimed in claim 1 wherein the IDT comprises two conductive rails to which the inter-digital fingers in the active region are alternately connected, wherein the active region includes main and dummy fingers aligned with and opposite one another, each connected to a respective one of said rails and having a gap therebetween, and wherein the fingers in the reflection-suppressing region extend on at least one side of the last gap between main and dummy fingers in the active region and are electrically connected to the conductive rail on that side, the lengths of the fingers in the reflection-suppressing region decreasing successively to define said back edge of the IDT with a substantially linear taper from said last gap.

5. A SAW device as claimed in claim 4 wherein the fingers in the reflection-suppressing region extend on both sides of said last gap, the fingers on each side being electrically connected to the conductive rail on that side, to define said back edge of the IDT with two substantially linear tapers each from said last gap towards a respective one of said two conductive rails.

6. A SAW device as claimed in claim 4 and including a surface acoustic wave absorber on said surface between the back edge of the IDT and an edge of the substrate, the absorber having a tapered front edge substantially complementary to the tapered back edge of the IDT.

7. A SAW device as claimed in claim 6 wherein the surface acoustic wave absorber comprises a thin resistive film on said surface.

8. A SAW device as claimed in claim 7 wherein the thin resistive film extends beneath the fingers and conductive rails of the IDT.

9. A SAW device as claimed in claim 6 wherein the acoustic absorber comprises a silicon film on said surface, said film having a sheet resistivity of at least about 0.5 Mohm/sq.

10. A SAW device as claimed in claim 4 wherein the main and dummy fingers in the active region each comprise a pair of equal-length fingers spaced apart with a pitch of lambda/4.

11. A SAW device as claimed in claim 5 wherein the main and dummy fingers in the active region each comprise a pair of equal-length fingers spaced apart with a pitch of lambda/4.

12. A SAW device as claimed in claim 1 and including a surface acoustic wave absorber on said surface between the back edge of the IDT and an edge of the substrate, the absorber having a tapered front edge substantially complementary to the tapered back edge of the IDT.

13. A SAW device as claimed in claim 12 wherein the surface acoustic wave absorber comprises a thin resistive film on said surface.

14. A SAW device as claimed in claim 13 wherein the thin resistive film extends beneath the fingers of the IDT.

15. A SAW device as claimed in claim 12 wherein the absorber comprises a silicon film on said surface, said film having a sheet resistivity of at least about 0.5 Mohm/sq.

16. A SAW device as claimed in claim 2 and including a surface acoustic wave absorber on said surface between the back edge of the IDT and an edge of the substrate, the absorber having a tapered front edge substantially complementary to the tapered back edge of the IDT.

17. A SAW device as claimed in claim 16 wherein the surface acoustic wave absorber comprises a thin resistive film on said surface.

18. A SAW device as claimed in claim 17 wherein the thin resistive film extends beneath the fingers of the IDT.

19. A SAW device as claimed in claim 16 wherein the absorber comprises a silicon film on said surface, said film having a sheet resistivity of at least about 0.5 Mohm/sq.

20. A SAW device as claimed in claim 1 wherein the reflection-suppressing region comprises at least 40 fingers extending over a distance of at least 10 lambda.

21. A SAW device as claimed in claim 1 wherein the reflection-suppressing region comprises at least 100 fingers extending over a distance of at least 25 lambda.

22. A SAW device comprising a substrate having two IDTs on a surface thereof for propagating a surface acoustic wave therebetween, each IDT comprising an active region and a reflection-suppressing region as claimed in claim 1.

23. A SAW (surface acoustic wave) device comprising a substrate having an IDT (inter-digital transducer) on a surface thereof, the IDT comprising:
  an active region of inter-digital fingers, for transducing a surface acoustic wave for propagation on said surface via a front edge of the IDT with a predetermined aperture; and
  a reflection-suppressing region, having an aperture which is at least substantially as large as said predetermined aperture, adjacent to the active region and comprising a plurality of electrically interconnected fingers defining a tapered back edge of the IDT across at least part of said aperture, the fingers in the reflection-suppressing region being spaced apart with a pitch other than n.lambda2 where n is an integer and lambda is a wavelength of the propagated surface acoustic wave.

24. A SAW device as claimed in claim 23 wherein the IDT comprises a conductive rail to which a back one of the fingers in the active region is electrically connected, and wherein the fingers in the reflection-suppressing region are electrically connected to said conductive rail and have lengths which successively decrease from the lengths of said back one of the fingers in the active region to define said back edge of the IDT with a substantially linear taper across at least part of said aperture.

25. A SAW device as claimed in claim 23 wherein the IDT comprises two conductive rails to which the inter-digital fingers in the active region are alternately connected, wherein the active region includes main and dummy fingers aligned with and opposite one another, each connected to a respective one of said rails and having a gap therebetween, and wherein the fingers in the reflection-suppressing region extend on at least one side of the last gap between main and dummy fingers in the active region and are electrically connected to the conductive rail on that side, the lengths of the fingers in the reflection-suppressing region decreasing successively to define said back edge of the IDT with a substantially linear taper from said last gap.

* * * * *